United States Patent
Zhou

(10) Patent No.: US 10,355,031 B2
(45) Date of Patent: Jul. 16, 2019

(54) METHOD FOR MANUFACTURING ARRAY SUBSTRATE

(71) Applicant: Shenzhen China Star Optoelectronics Semiconductor Display Technology Co., LTd., Shenzhen, Guangdong (CN)

(72) Inventor: Zhichao Zhou, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 85 days.

(21) Appl. No.: 15/571,346

(22) PCT Filed: May 3, 2017

(86) PCT No.: PCT/CN2017/082814
§ 371 (c)(1),
(2) Date: Nov. 2, 2017

(87) PCT Pub. No.: WO2018/176567
PCT Pub. Date: Oct. 4, 2018

(65) Prior Publication Data
US 2019/0157315 A1     May 23, 2019

(30) Foreign Application Priority Data
Mar. 29, 2017   (CN) ..................... 2017 1 0197970

(51) Int. Cl.
*H01L 21/00*      (2006.01)
*H01L 27/12*      (2006.01)
*G02F 1/1362*     (2006.01)
*G02F 1/1368*     (2006.01)
*H01L 29/66*       (2006.01)
(Continued)

(52) U.S. Cl.
CPC ........ *H01L 27/1259* (2013.01); *G02F 1/1368* (2013.01); *G02F 1/136286* (2013.01); *H01L 27/124* (2013.01); *H01L 29/22* (2013.01); *H01L 29/6675* (2013.01); *H01L 29/7866* (2013.01);
(Continued)

(58) Field of Classification Search
CPC ... H01L 27/1259; H01L 27/124; H01L 29/22; H01L 29/6675; H01L 29/7866; H01L 29/7869
See application file for complete search history.

(56) References Cited

U.S. PATENT DOCUMENTS 5,324,673 A * 6/1994 Fitch ................. H01L 21/28525
257/329
5,656,526 A * 8/1997 Inada .................... G02F 1/1362
349/187
(Continued)

*Primary Examiner* — Richard A Booth
(74) *Attorney, Agent, or Firm* — Hauptman Ham, LLP

(57) ABSTRACT

A method for manufacturing an array substrate includes forming a buffer layer on a substrate; forming a source and a data line in the buffer layer, forming a first gate, a second gate, a first scan line, and a second scan line on the buffer layer, simultaneously; forming a semiconductor layer; forming a conductor layer by converting the semiconductor layer formed on the first scan line and the second scan line into a conductor; forming a first pixel electrode on the semiconductor layer and forming a second pixel electrode on the conductor layer, simultaneously.

18 Claims, 5 Drawing Sheets

(51) Int. Cl.
*H01L 29/786* (2006.01)
*H01L 29/22* (2006.01)
*H01L 21/77* (2017.01)

(52) U.S. Cl.
CPC .... *H01L 29/7869* (2013.01); *H01L 2021/775* (2013.01)

(56) References Cited

U.S. PATENT DOCUMENTS

2018/0138212 A1* 5/2018 Yamazaki ........... H01L 27/1255
2018/0166578 A1* 6/2018 Yamazaki ............... H01L 21/02

* cited by examiner

METHOD FOR MANUFACTURING ARRAY SUBSTRATE

FIELD OF THE INVENTION

The present disclosure relates to the field of liquid crystal panels, and more particularly to a method for manufacturing an array substrate.

BACKGROUND OF THE INVENTION

In the industry of liquid crystal panels, an arrangement of liquid crystals is controlled by an array substrate, so as to display different grayscale light. The array substrate is an important part of the liquid crystal panel, and the production thereof is also an important manufacturing technology of the liquid crystal panel.

Presently, due to the good performance, people pay more attention to the array substrate having an annular gate structure. However, when the array substrate having the annular gate structure is applied to mass production, the process steps thereof are complex and the cost is relatively high.

As a result, it is necessary to provide a method for manufacturing an array substrate to solve the problems existing in the conventional technologies, as described above.

SUMMARY OF THE INVENTION

An object of the present disclosure is to provide a method for manufacturing an array substrate, which is to solve the problems of complex process steps and relatively high cost in the array substrate existing in the conventional technologies.

To achieve the above object, the present disclosure provides a method for manufacturing an array substrate, which includes:

forming a substrate;

forming a buffer layer on the substrate;

forming a source and a data line in the buffer layer, and forming a first gate, a second gate, a first scan line, and a second scan line on the buffer layer, simultaneously, wherein the data line is connected with the source, the first gate and the second gate are electrically connected together and surround the source, the second scan line is connected with the first gate and the second gate;

forming a semiconductor layer on the source, the first scan line, and the second scan line;

forming a conductor layer by converting the semiconductor layer formed on the first scan line and the second scan line into a conductor;

forming a first pixel electrode on the semiconductor layer and forming a second pixel electrode on the conductor layer, simultaneously, wherein the first pixel electrode makes the first scan line be connected with the second line by the conductor layer;

the step of forming the source and the data line in the buffer layer and forming the first gate, the second gate, the first scan line, and the second scan line, simultaneously, including:

forming a photoresist layer on the buffer layer;

forming a first gate area, a second gate area, a first scan line area, a second scan line area, a source area, and a data line area by using a yellow light process and an etching process;

forming a metal layer on the photoresist layer to cover the first gate area, the second gate area, the first scan line area, the second scan line area, the source area, and the data line area;

stripping the photoresist layer and the metal layer formed on the photoresist layer by using a stripping process;

the step of forming the semiconductor layer on the source, the first scan line, and the second line, including:

forming an insulation layer on the buffer layer to cover the source, the data line, the first gate, the second gate, the first scan line, and the second scan line;

forming the photoresist layer on the insulation layer to allow the source, the first scan line, and the second scan line to be exposed to the outside;

forming the semiconductor layer on the source, the first scan line, and the second scan line.

In the manufacturing method of the array substrate of the present disclosure, the step of forming the photoresist layer on the insulation layer to allow the source, the first scan line, and the second scan line to be exposed to the outside, includes:

forming the photoresist layer on the insulation layer;

using the yellow light process and the etching process to allow the source, the first scan line, and the second scan line to be exposed to the outside.

In the manufacturing method of the array substrate of the present disclosure, the step of forming the semiconductor layer on the source, the first scan line, and the second scan line, includes:

forming the semiconductor layer on the photoresist layer to cover the first scan line, the second scan line, and the source;

stripping the semiconductor layer formed on the photoresist layer by using a stripping process.

In the manufacturing method of the array substrate of the present disclosure, the step of forming the conductor layer by converting the semiconductor layer formed on the first scan line and the second scan line into a conductor, includes:

forming the photoresist layer by using the yellow light process to allow the semiconductor layer formed on the first scan line and the second scan line to be exposed to the outside;

converting the semiconductor layer formed on the first scan line and the second scan line into a conductor.

In the manufacturing method of the array substrate of the present disclosure, the semiconductor layer formed on the first scan line and the second scan line is converted into a conductor by using argon, nitrogen, and ammonia.

In the manufacturing method of the array substrate of the present disclosure, the step of forming the first pixel electrode on the semiconductor layer and forming the second pixel electrode on the conductor layer, simultaneously, includes:

forming the photoresist layer by using the yellow light process to allow the conductor layer, the semiconductor layer, and an area between the first scan line and the second scan line to be exposed to the outside;

forming a pixel electrode layer on the photoresist layer to cover the conductor layer, the semiconductor layer, and the area between the first scan line and the second scan line;

stripping the photoresist layer and the pixel electrode layer formed on the photoresist layer by using the stripping process.

In the manufacturing method of the array substrate of the present disclosure, a material of the semiconductor layer is indium gallium zinc oxide (IGZO).

In the manufacturing method of the array substrate of the present disclosure, the buffer layer is silicon nitride layer, silicon dioxide layer, or aluminum oxide layer.

Furthermore, the present disclosure provides another method for manufacturing an array substrate, which includes:

forming a substrate;

forming a buffer layer on the substrate;

forming a source and a data line in the buffer layer, forming a first gate, a second gate, a first scan line, and a second scan line on the buffer layer, simultaneously, wherein the data line is connected with the source, the first gate and the second gate are electrically connected together and surround the source, and the second scan line is connected with the first gate and the second gate;

forming a semiconductor layer on the source, the first scan line, and the second scan line;

forming a conductor layer by converting the semiconductor layer formed on the first scan line and the second scan line into a conductor;

forming a first pixel electrode on the semiconductor layer and forming a second pixel electrode on the conductor layer, simultaneously, wherein the first pixel electrode makes the first scan line be connected with the second line by the conductor layer.

In the manufacturing method of the array substrate of the present disclosure, the step of forming the source and the data line in the buffer layer and forming the first gate, the second gate, the first scan line, and the second scan line on the buffer layer, simultaneously, includes:

forming the photoresist layer on the buffer layer;

forming a first gate area, a second gate area, a first scan line area, a second scan line area, a source area, and a data line area by using a yellow light process and an etching process;

forming a metal layer on the photoresist layer to cover the first gate area, the second gate area, the first scan line area, the second scan line area, the source area, and the data line area;

stripping the photoresist layer and the metal layer formed on the photoresist layer by using a stripping process.

In the manufacturing method of the array substrate of the present disclosure, the step of forming the semiconductor layer on the source, the first scan line, and the second scan line, includes:

forming an insulation layer on the buffer layer to cover the source, the data line, the first gate, the second gate, the first scan line, and the second scan line;

forming the photoresist layer on the insulation layer to allow the source, the first scan line, and the second scan line to be exposed to the outside;

forming the semiconductor layer on the source, the first scan line, and the second scan line.

In the manufacturing method of the array substrate of the present disclosure, the step of forming the photoresist layer on the insulation layer to allow the source, the first scan line, and the second scan line to be exposed to the outside, includes:

forming the photoresist layer on the insulation layer;

using the yellow light process and the etching process to allow the source, the first scan line, and the second scan line to be exposed to the outside.

In the manufacturing method of the array substrate of the present disclosure, the step of forming the semiconductor layer on the source, the first scan line, and the second scan line, includes:

forming the semiconductor layer on the photoresist layer to cover the first scan line, the second scan line, and the source;

stripping the semiconductor layer formed on the photoresist layer by using a stripping process.

In the manufacturing method of the array substrate of the present disclosure, the step of forming a conductor layer by converting the semiconductor layer formed on the first scan line and the second scan line in a conductor, includes:

forming the photoresist layer by using the yellow light process to allow the semiconductor layer formed on the first scan line and the second scan line to be exposed to the outside;

converting the semiconductor layer formed on the first scan line and the second scan line into a conductor.

In the manufacturing method of the array substrate of the present disclosure, the semiconductor layer formed on the first scan line and the second scan line is converted into a conductor by using argon, nitrogen, and ammonia.

In the manufacturing method of the array substrate of the present disclosure, the step of forming the first pixel electrode on the semiconductor layer and forming the second pixel electrode on the conductor layer, simultaneously, includes:

forming the photoresist layer by using the yellow light process to allow the conductor layer, the semiconductor layer, and an area between the first scan line and the second scan line to be exposed to the outside;

forming a pixel electrode layer on the photoresist layer to cover the conductor layer, the semiconductor layer, and the area between the first scan line and the second scan line;

stripping the photoresist layer and the pixel electrode layer formed on the photoresist layer by using the stripping process.

In the manufacturing method of the array substrate of the present disclosure, a material of the semiconductor layer is indium gallium zinc oxide (IGZO).

In the manufacturing method of the array substrate of the present disclosure, the buffer layer is silicon nitride layer, silicon dioxide layer, or aluminum oxide layer.

The method for manufacturing the array substrate of the present disclosure includes: forming a substrate; forming a buffer layer on the substrate; forming a source and a data line in the buffer layer, forming a first gate, a second gate, a first scan line, and a second scan line on the buffer layer, simultaneously; forming a semiconductor layer on the source, the first scan line, and the second scan line; forming a conductor layer by converting the semiconductor layer formed on the first scan line and the second scan line into a conductor; forming a first pixel electrode on the semiconductor layer and forming a second pixel electrode on the conductor layer, simultaneously. The method for manufacturing the array substrate of the present disclosure provides relatively easier process steps, increases production efficiency, and reduces production cost.

For more clearly and easily understanding above content of the present disclosure, the following text will take a preferred embodiment of the present disclosure with reference to the accompanying drawings for detailed description as follows.

DESCRIPTION OF THE DRAWINGS

The technical solution, as well as beneficial advantages, of the present disclosure will be apparent from the following detailed description of one or more embodiments of the present disclosure, with reference to the attached drawings. In the drawings.

DETAILED DESCRIPTION OF THE PREFERRED EMBODIMENTS

To further expound the technical solution adopted in the present disclosure and the advantages thereof, a detailed description is given to a preferred embodiment of the present disclosure and the attached drawings. Obviously, the embodiments described herein are only a part of, but not all of, the embodiments of the present disclosure. In view of the embodiments described herein, any other embodiment obtained by the person skilled in the field without offering creative effort is included in a scope claimed by the present disclosure.

Figure 1:
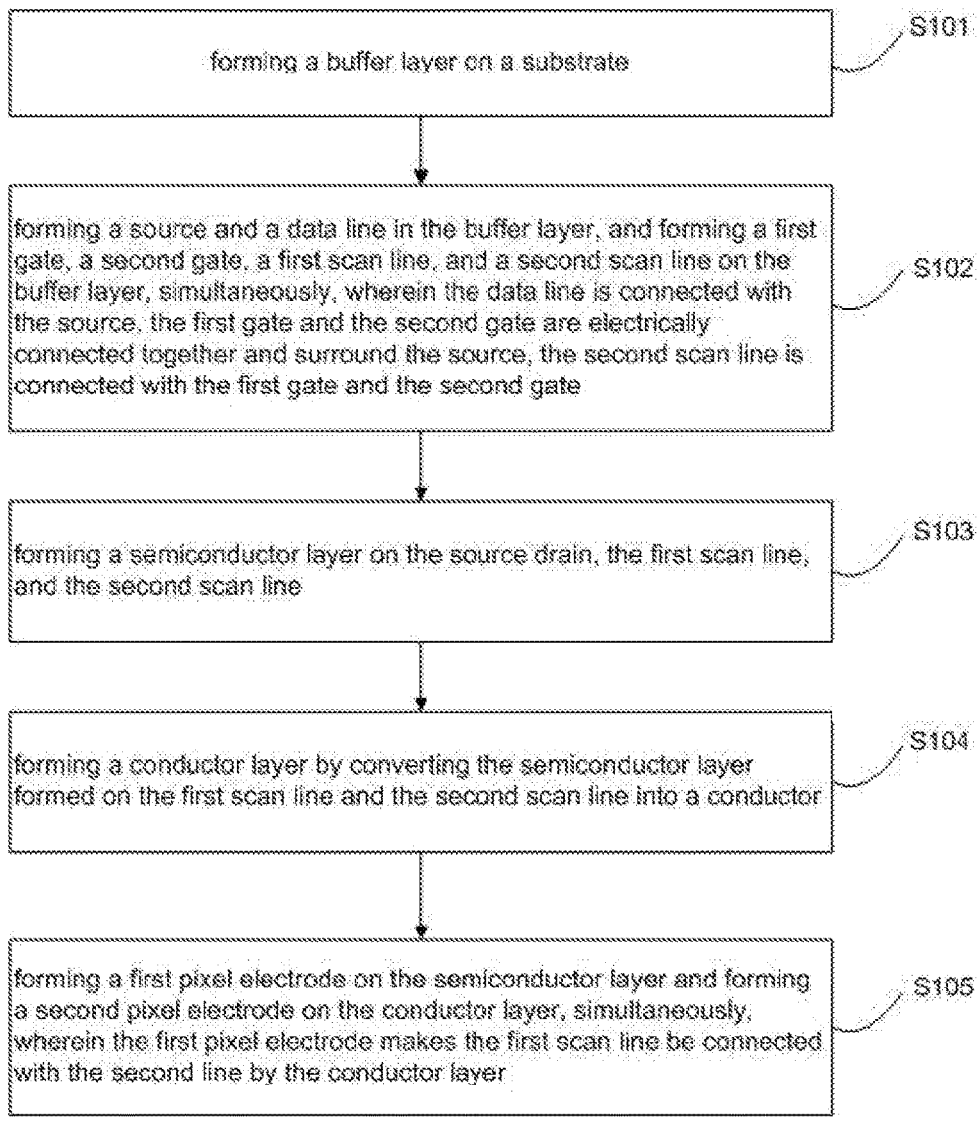
FIG. 1 is a flow chart illustrating a method for manufacturing an array substrate according to a preferred embodiment of the present disclosure.

Referring now to FIG. 1, a method for manufacturing an array substrate according to a preferred embodiment of the present disclosure is illustrated. As shown in FIG. 1, the method for manufacturing the array substrate of the preferred embodiment includes the following steps:

Step S101: forming a buffer layer on a substrate.

Step S102: forming a source and a data line in the buffer layer, and forming a first gate, a second gate, a first scan line, and a second scan line on the buffer layer, simultaneously, wherein the data line is connected with the source, the first gate and the second gate are electrically connected together and surround the source, the second scan line is connected with the first gate and the second gate.

Step S103: forming a semiconductor layer on the source, the first scan line, and the second scan line.

Step S104: forming a conductor layer by converting the semiconductor layer formed on the first scan line and the second scan line into a conductor.

Step S105: forming a first pixel electrode on the semiconductor layer and forming a second pixel electrode on the conductor layer, simultaneously, wherein the first pixel electrode makes the first scan line be connected with the second scan line by the conductor layer.

Figure 2A:
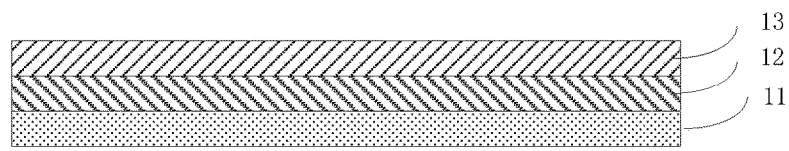
FIGS. 2A-2D are schematic views showing the structures according to the steps of forming a source, a data line, a first gate, a second gate, a first scan line, and a second scan line of the method for manufacturing the array substrate in FIG. 1.
Figure 2B:
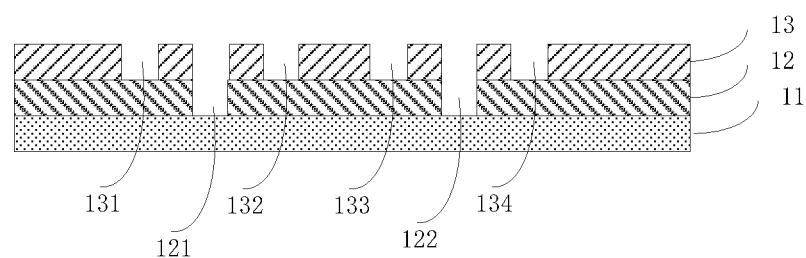
Figure 2C:
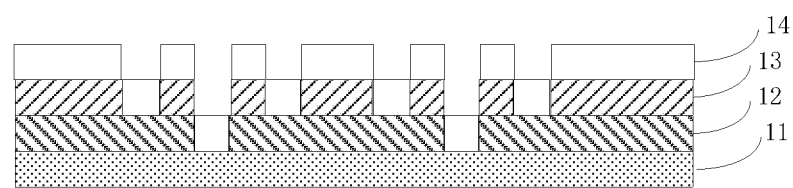
Figure 2D:
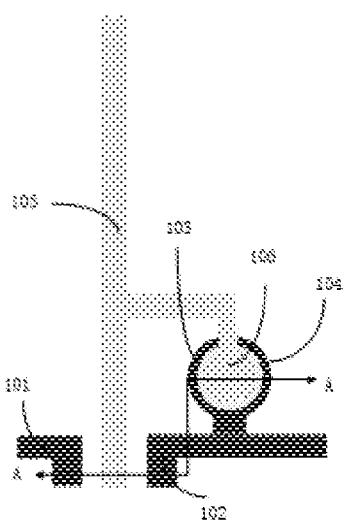
Figure 2D:
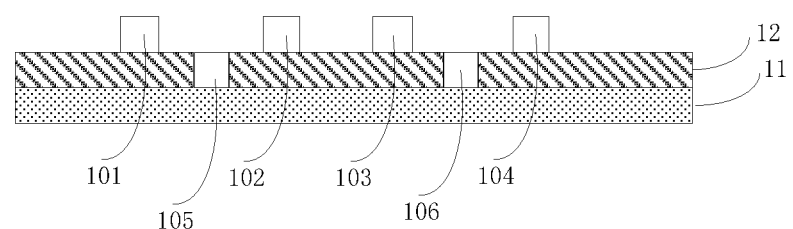

Specifically, FIGS. 2A-2D are schematic views showing the structures according to the steps of forming a source, a data line, a first gate, a second gate, a first scan line, and a second scan line of the method for manufacturing the array substrate in FIG. 1. The above drawing of FIG. 2D is a top view of the array substrate, and the below drawing of FIG. 2D is a cross section A-A view of the array substrate. Please refer to FIGS. 2A-2D, the embodiment of the present disclosure provides the method of manufacturing the array substrate including step S102. As shown in FIG. 2A, a buffer layer 12 and a photoresist layer 13 are formed successively on a substrate 11. Then, as shown in FIG. 2B, a first gate area 133, a second gate area 134, a first scan line area 131, a second scan line area 132, a source area 122, and a data line area 121 are formed by using a yellow light process and an etching process. Then, as shown in FIG. 2C, a metal layer 14 is formed on the photoresist layer 13 to cover the first gate area 133, the second gate area 134, the first scan line area 132, the second scan line area 131, the source area 122, and the data line area 121. Finally, as shown in FIG. 2D, the photoresist layer 13 and the metal layer 14 formed on the photoresist layer 13 are stripped by using a stripping process. In particularly, the data line 105 is connected with the source 106, the first gate 103 and the second gate 104 are electrically connected together and surround the source 106, and the second scan line 102 is connected with the first gate 103 and the second gate 104.

Figure 3A:
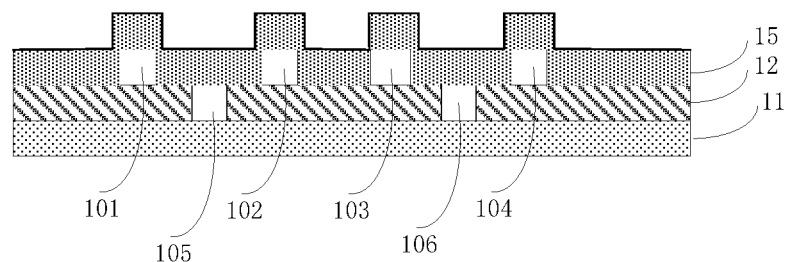
FIGS. 3A-3E are schematic views showing the structures according to the steps of forming a semiconductor layer on a source, a first scan line, and a second scan line of the method for manufacturing the array substrate in FIG. 1.

Specifically, FIGS. 3A-3E are schematic views showing the structures according to the steps of forming a semiconductor layer on a source, a first scan line, and a second scan line of the method for manufacturing the array substrate in FIG. 1. Please refer to FIGS. 3A-3E, the embodiment of the present disclosure provides the method of manufacturing the array substrate including step S103. First, as shown in FIG. 3A, an insulation layer 12 is formed on the buffer layer 15 to cover the source 106, the data line 105, the first gate 103, the second gate 104, the first scan line 101, and the second scan line 102.

Figure 3B:
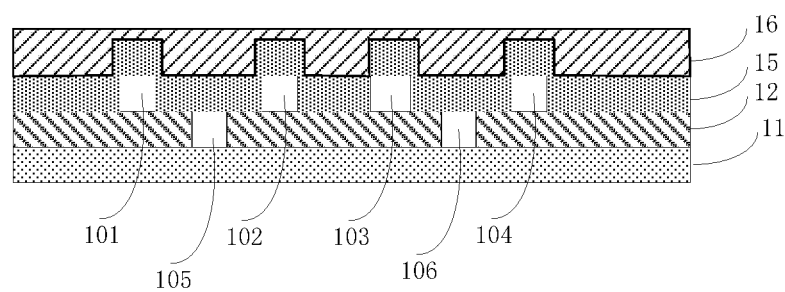
Figure 3C:
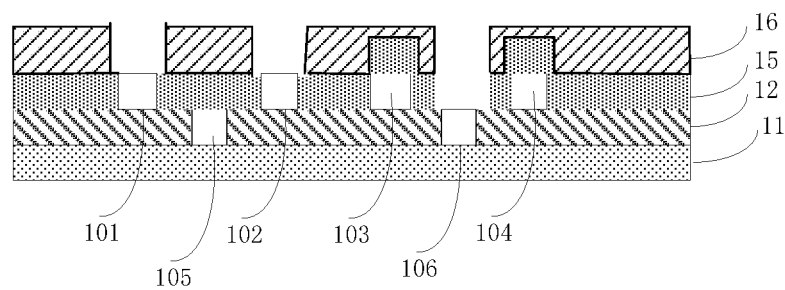

Then, the photoresist layer 16 is formed on the insulation layer 15 to allow the source 106, the first scan line 101, and the second scan line 102 to be exposed to the outside. Specifically, as shown in FIG. 3B, the photoresist layer 16 is formed on the insulation layer 15. Then, as shown in FIG. 3C, the yellow light process and the etching process are used to allow the source 106, the first scan line 101, and the second scan line 102 to be exposed to the outside.

Figure 3D:
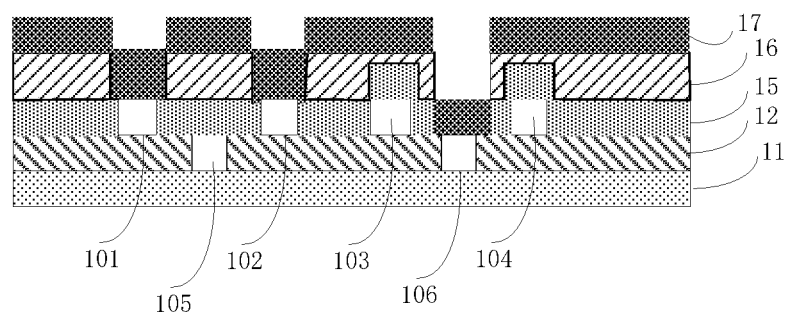
Figure 3E:
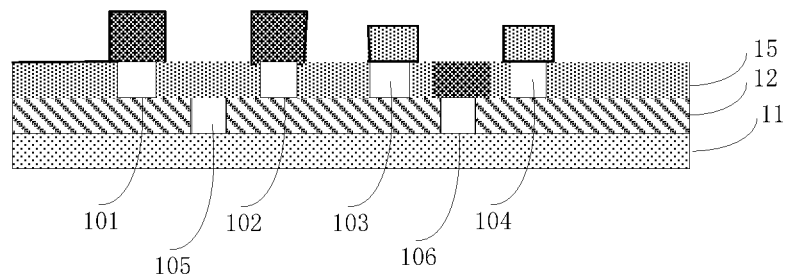

Finally, the semiconductor layer 17 is formed on the source 106, the first scan line 101, and the second scan line 102. Specifically, as shown in FIG. 3D, the semiconductor layer 17 is formed on the photoresist layer 16 to cover the first scan line 101, the second scan line 102, and the source 106. Then, as shown in FIG. 3E, the semiconductor layer 17 formed on the photoresist layer 16 is stripped by using a stripping process.

Figure 4A:
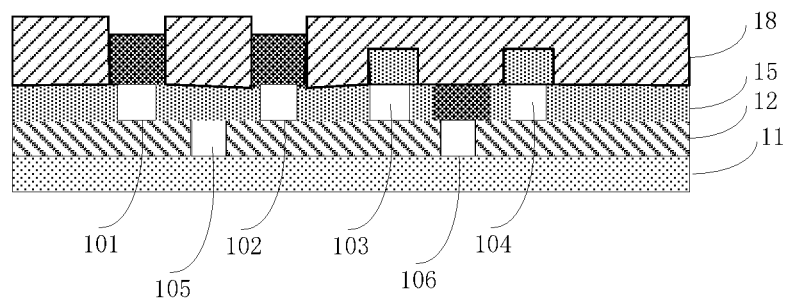
FIGS. 4A-4C are schematic views showing the structures according to the steps of forming a semiconductor layer on a source, a first scan line, and a second scan line and forming a conductor layer by converting the semiconductor layer formed on the first scan line and the second scan line into a conductor of the method for manufacturing the array substrate in FIG. 1.
Figure 4B:
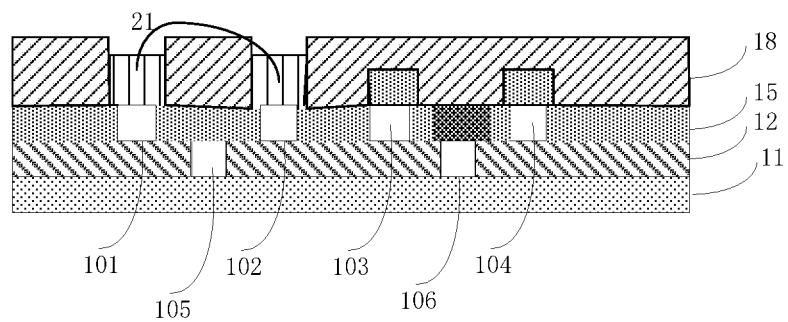
Figure 4C:
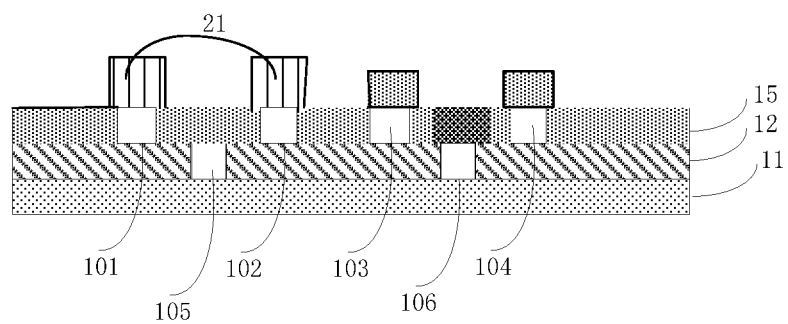

Specifically, FIGS. 4A-4C are schematic views showing the structures according to the steps of forming a semiconductor layer on a source, a first scan line, and a second scan line and forming a conductor layer by converting the semiconductor layer formed on the first scan line and the second scan line into a conductor of the method for manufacturing the array substrate in FIG. 1. Please refer to FIGS. 4A-4C, the embodiment of the present disclosure provides the method of manufacturing the array substrate including step S104. As shown in FIG. 4A, the photoresist layer 18 is formed by using the yellow light process to allow the semiconductor layer formed on the first scan line 101 and the second scan line 102 to be exposed to the outside. Then, as shown in FIG. 4B, the semiconductor layer formed on the first scan line 101 and the second scan line 102 is converted into a conductor. In the preferred embodiment, the semiconductor layer formed on the first scan line 101 and the second scan line 102 is converted into a conductor by using argon, nitrogen, and ammonia. Finally, as shown in FIG. 4C, the photoresist layer 16 is stripped.

Figure 5A:
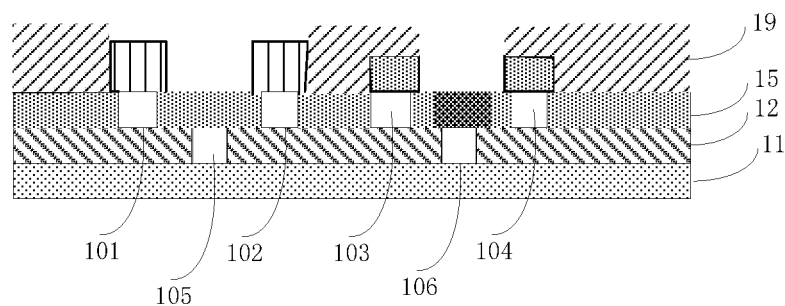
FIGS. 5A-5C are schematic views showing the structures according to the steps of forming a first pixel electrode on the semiconductor layer and forming a second pixel electrode on the conductor layer, simultaneously of the method for manufacturing the array substrate in FIG. 1.
Figure 5B:
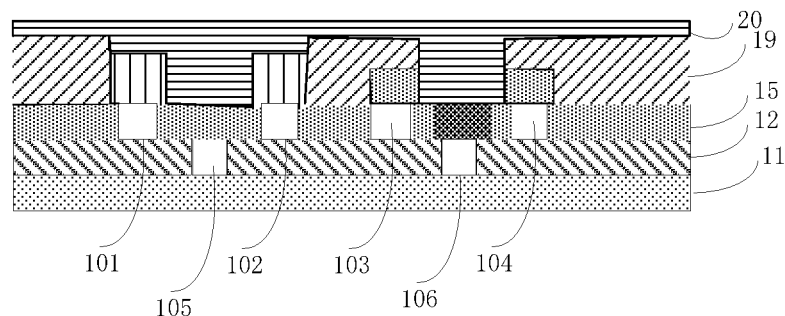
Figure 5C:
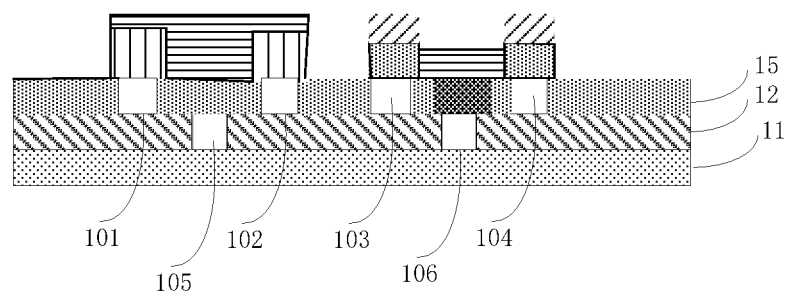

Specifically, FIGS. 5A-5C are schematic views showing the structures according to the steps of forming a first pixel electrode on the semiconductor layer and forming a second pixel electrode on the conductor layer, simultaneously of the method for manufacturing the array substrate in FIG. 1. Please refer to FIGS. 5A-5C, the embodiment of the present disclosure provides the method of manufacturing the array substrate including step S105. As shown in FIG. 5A, the photoresist layer 19 is formed by using the yellow light process to allow the conductor layer 21, the semiconductor layer 17, and an area between the first scan line 101 and the second scan line 102 to be exposed to the outside. Then, as shown in FIG. 5B, a pixel electrode layer 20 is formed on the photoresist layer 19 to cover the conductor layer 21, the semiconductor layer 17, and the area between the first scan line 101 and the second scan line 102. Finally, as shown in FIG. 5C, the photoresist layer 19 and the pixel electrode layer 20 formed on the photoresist layer 19 are stripped by using the stripping process.

In the preferred embodiment, a material of the semiconductor layer is indium gallium zinc oxide (IGZO). The buffer layer 12 is silicon nitride layer, silicon dioxide layer, or aluminum oxide layer.

The method for manufacturing the array substrate of the present disclosure includes forming the substrate; forming the buffer layer on the substrate; forming the source and the data line in the buffer layer, forming the first gate, the second gate, the first scan line, and the second scan line on the buffer layer, simultaneously; forming the semiconductor layer on the source, the first scan line, and the second scan line; forming the conductor layer by converting the semiconductor layer formed on the first scan line and the second scan line into a conductor; forming the first pixel electrode on the semiconductor layer and forming the second pixel electrode on the conductor layer, simultaneously. The method for manufacturing the array substrate of the present disclosure provides relatively easier process steps, increases production efficiency, and reduces production cost.

The present disclosure has been described with a preferred embodiment thereof. The preferred embodiment is not intended to limit the present disclosure, and it is understood that many changes and modifications to the described embodiment can be carried out without departing from the scope and the spirit of the invention that is intended to be limited only by the appended claims.

What is claimed is:

1. A method for manufacturing an array substrate, comprising:
    forming a substrate;
    forming a buffer layer on the substrate;
    forming a source and a data line in the buffer layer, forming a first gate, a second gate, a first scan line, and a second scan line on the buffer layer, simultaneously, wherein the data line is connected with the source, the first gate and the second gate are electrically connected together and surround the source, and the second scan line is connected with the first gate and the second gate;
    forming a semiconductor layer on the source, the first scan line, and the second scan line;
    forming a conductor layer by converting the semiconductor layer formed on the first scan line and the second scan line into a conductor;
    forming a first pixel electrode on the semiconductor layer and forming a second pixel electrode on the conductor layer, simultaneously, wherein the first pixel electrode makes the first scan line be connected with the second line by the conductor layer;
    the step of forming the source and the data line in the buffer layer and forming the first gate, the second gate, the first scan line, and the second scan line, simultaneously, comprising:
    forming a photoresist layer on the buffer layer;
    forming a first gate area, a second gate area, a first scan line area, a second scan line area, a source area, and a data line area by using a yellow light process and an etching process;
    forming a metal layer on the photoresist layer to cover the first gate area, the second gate area, the first scan line area, the second scan line area, the source area, and the data line area;
    stripping the photoresist layer and the metal layer formed on the photoresist layer by using a stripping process;
    the step of forming the semiconductor layer on the source, the first scan line, and the second scan line, comprising:
    forming an insulation layer on the buffer layer to cover the source, the data line, the first gate, the second gate, the first scan line, and the second scan line;
    forming the photoresist layer on the insulation layer to allow the source, the first scan line, and the second scan line to be exposed to the outside;
    forming the semiconductor layer on the source, the first scan line, and the second scan line.

2. The method according to claim 1, wherein the step of forming the photoresist layer on the insulation layer to allow the source, the first scan line, and the second scan line to be exposed to the outside, comprises:
    forming the photoresist layer on the insulation layer;
    using the yellow light process and the etching process to allow the source, the first scan line, and the second scan line to be exposed to the outside.

3. The method according to claim 1, wherein the step of forming the semiconductor layer on the source, the first scan line, and the second scan line, comprises:
    forming the semiconductor layer on the photoresist layer to cover the first scan line, the second scan line, and the source;
    stripping the semiconductor layer formed on the photoresist layer by using a stripping process.

4. The method according to claim 1, wherein the step of forming the conductor layer by converting the semiconductor layer formed on the first scan line and the second scan line into a conductor, comprises:
    forming the photoresist layer by using the yellow light process to allow the semiconductor layer formed on the first scan line and the second scan line to be exposed to the outside;
    converting the semiconductor layer formed on the first scan line and the second scan line into a conductor.

5. The method according to claim 4, wherein the semiconductor layer formed on the first scan line and the second scan line is converted into a conductor by using argon, nitrogen, and ammonia.

6. The method according to claim 1, wherein the step of forming the first pixel electrode on the semiconductor layer and forming the second pixel electrode on the conductor layer, simultaneously, comprises:
    forming the photoresist layer by using the yellow light process to allow the conductor layer, the semiconductor layer, and an area between the first scan line and the second scan line to be exposed to the outside;

forming a pixel electrode layer on the photoresist layer to cover the conductor layer, the semiconductor layer, and the area between the first scan line and the second scan line;

stripping the photoresist layer and the pixel electrode layer formed on the photoresist layer by using the stripping process.

7. The method according to claim 1, wherein a material of the semiconductor layer is indium gallium zinc oxide (IGZO).

8. The method according to claim 1, wherein the buffer layer is silicon nitride layer, silicon dioxide layer, or aluminum oxide layer.

9. A method for manufacturing an array substrate, comprising:
forming a substrate;
forming a buffer layer on the substrate;
forming a source and a data line in the buffer layer, forming a first gate, a second gate, a first scan line, and a second scan line on the buffer layer, simultaneously, wherein the data line is connected with the source, the first gate and the second gate are electrically connected together and surround the source, and the second scan line is connected with the first gate and the second gate;
forming a semiconductor layer on the source, the first scan line, and the second scan line;
forming a conductor layer by converting the semiconductor layer formed on the first scan line and the second scan line into a conductor;
forming a first pixel electrode on the semiconductor layer and forming a second pixel electrode on the conductor layer, simultaneously, wherein the first pixel electrode makes the first scan line be connected with the second line by the conductor layer.

10. The method according to claim 9, wherein the step of forming the source and the data line in the buffer layer and forming the first gate, the second gate, the first scan line, and the second scan line on the buffer layer, simultaneously, comprises:
forming the photoresist layer on the buffer layer;
forming a first gate area, a second gate area, a first scan line area, a second scan line area, a source area, and a data line area by using a yellow light process and an etching process;
forming a metal layer on the photoresist layer to cover the first gate area, the second gate area, the first scan line area, the second scan line area, the source area, and the data line area;
stripping the photoresist layer and the metal layer formed on the photoresist layer by using a stripping process.

11. The method according to claim 9, wherein the step of forming the semiconductor layer on the source, the first scan line, and the second scan line, comprises:
forming an insulation layer on the buffer layer to cover the source, the data line, the first gate, the second gate, the first scan line, and the second scan line;
forming the photoresist layer on the insulation layer to allow the source, the first scan line, and the second scan line to be exposed to the outside;
forming the semiconductor layer on the source, the first scan line, and the second scan line.

12. The method according to claim 11, wherein the step of forming the photoresist layer on the insulation layer to allow the source, the first scan line, and the second scan line to be exposed to the outside, comprises:
forming the photoresist layer on the insulation layer;
using the yellow light process and the etching process to allow the source, the first scan line, and the second scan line to be exposed to the outside.

13. The method according to claim 11, wherein the step of forming the semiconductor layer on the source, the first scan line, and the second scan line, comprises:
forming the semiconductor layer on the photoresist layer to cover the first scan line, the second scan line, and the source;
stripping the semiconductor layer formed on the photoresist layer by using a stripping process.

14. The method according to claim 9, wherein the step of forming a conductor layer by converting the semiconductor layer formed on the first scan line and the second scan line into a conductor, comprises:
forming the photoresist layer by using the yellow light process to allow the semiconductor layer formed on the first scan line and the second scan line to be exposed to the outside;
converting the semiconductor layer formed on the first scan line and the second scan line into a conductor.

15. The method according to claim 14, wherein the semiconductor layer formed on the first scan line and the second scan line is converted into a conductor by using argon, nitrogen, and ammonia.

16. The method according to claim 9, wherein the step of forming the first pixel electrode on the semiconductor layer and forming the second pixel electrode on the conductor layer, simultaneously, comprises:
forming the photoresist layer by using the yellow light process to allow the conductor layer, the semiconductor layer, and an area between the first scan line and the second scan line to be exposed to the outside;
forming a pixel electrode layer on the photoresist layer to cover the conductor layer, the semiconductor layer, and the area between the first scan line and the second scan line;
stripping the photoresist layer and the pixel electrode layer formed on the photoresist layer by using the stripping process.

17. The method according to claim 9, wherein a material of the semiconductor layer is indium gallium zinc oxide (IGZO).

18. The method according to claim 9, wherein the buffer layer is silicon nitride layer, silicon dioxide layer, or aluminum oxide layer.

* * * * *